(12) United States Patent
Baur et al.

(10) Patent No.: US 10,050,553 B2
(45) Date of Patent: Aug. 14, 2018

(54) RECTIFIER CIRCUIT INCLUDING A SELF-CLAMPING TRANSISTOR

(71) Applicants: Robert Bosch GmbH, Stuttgart (DE); SEG Automotive Germany GmbH, Stuttgart (DE)

(72) Inventors: Markus Baur, Rottenburg (DE); Alfred Goerlach, Kusterdingen (DE)

(73) Assignees: Robert Bosch GmbH, Stuttgart (DE); SEG Automotive Germany GmbH, Stuttgart (DE)

( * ) Notice: Subject to any disclaimer, the term of this patent is extended or adjusted under 35 U.S.C. 154(b) by 0 days.

(21) Appl. No.: 15/116,542

(22) PCT Filed: Dec. 1, 2014

(86) PCT No.: PCT/EP2014/076059
§ 371 (c)(1),
(2) Date: Aug. 4, 2016

(87) PCT Pub. No.: WO2015/117691
PCT Pub. Date: Aug. 13, 2015

(65) Prior Publication Data
US 2016/0380554 A1 Dec. 29, 2016

(30) Foreign Application Priority Data
Feb. 5, 2014 (DE) .................. 10 2014 202 030

(51) Int. Cl.
*H02M 7/217* (2006.01)
*H03K 17/0814* (2006.01)
*H03K 17/30* (2006.01)

(52) U.S. Cl.
CPC ...... *H02M 7/217* (2013.01); *H03K 17/08142* (2013.01); *H03K 17/302* (2013.01);
(Continued)

(58) Field of Classification Search
CPC ............ H02M 7/217; H03K 17/08142; H03K 17/302; H03K 2017/307; H03K 2217/0081
See application file for complete search history.

(56) References Cited

U.S. PATENT DOCUMENTS 5,744,994 A    4/1998  Williams
6,281,527 B1   8/2001  Chen
(Continued)

FOREIGN PATENT DOCUMENTS

DE    10 2007 060219 A1    6/2009
DE    10 2007 060231 A1    6/2009
(Continued)

OTHER PUBLICATIONS

Shenai, et al. "Monolithically Intergrated Power MOSFET and Schottky Diode with Improved Reverse Recovery Characteristics", Transactions on Electron Devices, vol. 37, No. 4 (1990), pp. 1167-1169.
(Continued)

*Primary Examiner* — Adolf Berhane
*Assistant Examiner* — Bart Iliya
(74) *Attorney, Agent, or Firm* — Norton Rose Fulbright US LLP; Gerard Messina

(57) ABSTRACT

A rectifier circuit is described, which includes a cathode terminal, an anode terminal and, between the cathode terminal and the anode terminal, an electronic circuit which includes at least one MOSFET transistor including an integrated inverse diode, the drain-source breakdown voltage of the MOSFET transistor operated in the avalanche mode corresponding to the clamping voltage between the cathode terminal and the anode terminal of the rectifier circuit. In addition, a method is provided for operating a rectifier circuit which contains a cathode terminal, an anode terminal
(Continued)

and, between the cathode terminal and the anode terminal, at least one MOSFET transistor including an integrated inverse diode, the drain-source breakdown voltage of the MOSFET transistor being selected in accordance with the clamping voltage between the cathode terminal and the anode terminal, and the MOSFET transistor being operated in the avalanche mode.

7 Claims, 1 Drawing Sheet

(52) U.S. Cl.
CPC ............... *H03K 2017/307* (2013.01); *H03K 2217/0081* (2013.01)

(56) References Cited

U.S. PATENT DOCUMENTS

| | | | |
|---|---|---|---|
| 7,518,208 B2 | 4/2009 | Shirai et al. | |
| 8,427,801 B2 | 4/2013 | Goerlach et al. | |
| 9,172,310 B2 | 10/2015 | Goerlach et al. | |
| 2004/0108567 A1* | 6/2004 | Denison | H01L 29/0684 257/500 |
| 2006/0249806 A1 | 11/2006 | Shirai et al. | |
| 2008/0007883 A1* | 1/2008 | Arndt | B60R 16/03 361/56 |
| 2009/0079272 A1 | 3/2009 | Ludikhuize et al. | |
| 2010/0123185 A1* | 5/2010 | Hsieh | H01L 27/0255 257/328 |
| 2011/0227095 A1* | 9/2011 | Treu | H01L 23/49575 257/77 |
| 2011/0284958 A1* | 11/2011 | Haeberlen | H01L 29/0649 257/343 |
| 2013/0140890 A1* | 6/2013 | Nisonen | H02H 9/025 307/24 |
| 2014/0104908 A1 | 4/2014 | Mehringer et al. | |
| 2014/0146428 A1* | 5/2014 | Pansier | H03K 17/0822 361/86 |

FOREIGN PATENT DOCUMENTS

| | | |
|---|---|---|
| DE | 10 2010 063314 A1 | 6/2012 |
| DE | 10 2011 006 316 A1 | 10/2012 |
| JP | H0697456 A | 4/1994 |
| JP | 2004022960 A | 1/2004 |
| JP | 2005123596 A | 5/2005 |
| JP | 2012124565 A | 6/2012 |

OTHER PUBLICATIONS

Yilmaz, et al. "2.5 Million Cell/Inch2, Low-Voltage DMOS FET Technology", Applied Power Electronics Conference and Exposition, 1991. APEC 1991 6th Annual Conference Proceedings, pp. 513-518.
International Search Report issued in PCTG/EP2014/076059 dated Feb. 20, 2015.

* cited by examiner

RECTIFIER CIRCUIT INCLUDING A SELF-CLAMPING TRANSISTOR

FIELD

The present invention relates to a rectifier circuit, an electronic component including a rectifier circuit, a generator for the voltage supply of a motor vehicle including a rectifier circuit, and a method for operating a rectifier circuit.

BACKGROUND INFORMATION

In order to generate DC voltages from AC voltages, rectifier bridges made up of an interconnection of diodes are mostly utilized at present. Alternatively, synchronous rectifiers or active rectifiers may be utilized instead of diodes, in order to reduce the conducting state power losses. In this case, suitable power MOSFETs replace the diodes which are usually utilized. This results in greater circuit complexity, since precise control with respect to time is necessary for the MOSFETs. Such additional circuitry parts are mostly combined in integrated circuits and are connected to the particular gate terminals of the MOSFETs.

A simple variant of a synchronous rectifier is described in German Patent Application No. DE 10 2007 060 219 A1. Therein, the additional circuit elements are individually assigned to each power MOSFET. The additional circuit elements are each supplied with current by a small backup capacitor in this case. If the additional circuit elements, which are composed of transistors, diodes, resistors, and the backup capacitor, are integrated together with the power MOSFET into a small housing, the component formed in this way is interconnectable like a diode.

Circuit arrangements of this type may also be designed in such a way that they allow for a limitation of high voltage peaks. High voltage peaks occur, for example, when large, sudden load changes occur in an AC generator. Such a generator may be, for example, a 3-phase or multiphase motor vehicle generator. Such a brief operating condition is referred to as a load dump.

FIG. 1 from German Patent Application No. DE 10 2007 060 219 A1 shows a rectifier circuit which is utilized instead of a silicon PN diode in a rectifier bridge. It includes not only a silicon PN diode but also a cathode terminal K1 and an anode terminal A1. MOS transistor T1 and inverse diode D6 are connected in parallel and, together in this interconnection, technically form a microelectronic component.

The rectifier circuit includes a symmetrically configured differential amplifier which is formed by transistors T2 and T3 and resistors R1, R2 and R3. A first input of this differential amplifier is connected via a diode D1 to cathode terminal K1 and to drain terminal of MOS transistor T1. A second input of this differential amplifier is connected via a diode D2 to anode terminal A1. This differential amplifier amplifies the potential difference between cathode terminal K1 and anode terminal A1 of the rectifier circuit. Due to the symmetrical configuration of the differential amplifier, temperature differences and aging effects have only a slight effect on the properties of the differential amplifier.

The output signal from the differential amplifier is available at the collector of transistor T3 and is relayed via a resistor R4 to the input of a current amplifier stage. This current amplifier stage is made up of transistors T4 and T5, the bases of which are interconnected. Zener diode D5 acts as a protective element for transistor T1 and protects its gate against overvoltages.

When an AC voltage is rectified, an AC voltage having frequency f is present between cathode terminal K1 and anode terminal A1. When there is positive potential at cathode terminal K1, MOS transistor T1, with its integrated inverse diode D6, is in the blocking mode and capacitor C1 may charge itself via diode D3 and resistor R5. The voltage present at capacitor C1 is used for supplying the further components of the rectifier circuit.

However, if the electric potential at cathode terminal K1 is more negative than the electric potential at anode terminal A1 of the rectifier circuit, the gate-source voltage of MOS transistor T1 is positive and higher than its threshold voltage. MOS transistor T1 is conductive under these conditions, a current flow having this current direction causing only a slight voltage drop.

If the electric potential at cathode terminal K1 of the rectifier circuit is again more positive than the electric potential at anode terminal A1 of the rectifier circuit, the gate-source voltage of MOS transistor T1 is less than its threshold voltage. MOS transistor T1 blocks under these conditions. For this reason, the current flow through MOS transistor T1 is only very slight.

If the electric potential at cathode terminal K1 of the rectifier circuit is more positive than the electric potential at anode terminal A1 of the rectifier circuit and this potential difference exceeds a value set by Zener diode D4, the input potential of the current amplifier stage, which is made up of transistors T4 and T5, is raised. As a result, the gate-source voltage of MOS transistor T1 also increases, and current flows between the drain and the source of MOS transistor T1. Under the given conditions, this current flow limits the electric potential difference between cathode terminal K1 and anode terminal A1 of the rectifier circuit to a predetermined value. This feature of limiting the potential difference is a clamping voltage and, in special cases, forms a protection against overvoltages or forms a load dump protection.

In this case, the electric strength of MOSFET transistor T1 is designed in such a way that its drain-source breakdown voltage is substantially higher than the clamping voltage of the circuit determined by clamping diode D4. For example, at a clamping voltage of 22 V, a power MOSFET transistor having a drain-source breakdown voltage of approximately 40 V is utilized. During the clamping with the aid of diode D4, transistor T1 is simultaneously operated at high voltages and currents. This is referred to as operation in current saturation or also as the linear mode.

The linear mode is unstable, in particular, in modern MOSFET transistors with their small cell structures. At high drain-source voltages and high drain currents, the current tends to constrict at a point, which may result in the destruction of the component.

SUMMARY

According to the present invention, a rectifier circuit is provided, which includes a cathode terminal, an anode terminal and, between the cathode terminal and the anode terminal, an electronic circuit which contains at least one MOSFET transistor having an integrated inverse diode, the drain-source breakdown voltage of the MOSFET transistor operated in the avalanche mode corresponding to the clamping voltage between the cathode terminal and the anode terminal of the rectifier circuit.

According to the present invention, it is provided that, instead of the previously used, active voltage clamping, a MOSFET transistor is used, whose drain-source breakdown voltage corresponds to the desired clamping voltage. Since the property of the reduced drain-source breakdown voltage is coupled to the reduction of the closing resistor, the method described here simultaneously results in the reduction of the power loss occurring in the rectifier mode.

In addition, if the chip area of the power transistor is unchanged, the conducting state power losses in the rectifier mode are reduced and, additionally, a greater load capacity in the voltage clamping mode is achieved.

The MOSFET transistor may be a planar, vertical DMOS-FET transistor. A transistor in DMOS technology (double-diffused metal-oxide semiconductor) is particularly well suited for this operation.

The structures of the MOSFET transistor are advantageously designed in such a way that the power loss incurred in the avalanche breakdown is distributed at least approximately uniformly over the active chip area.

The structures of the MOSFET transistor are advantageously designed in such a way that an injection of charge carriers into a gate oxide of the MOSFET transistor is avoided.

The MOSFET transistor may be a trench MOS transistor. Since, according to the present invention, the avalanche mode is advantageously utilized instead of the linear mode, it is now possible to also utilize trench transistors having a small cell size.

According to the present invention, an electronic component for rectifying AC voltages, which includes at least one previously described rectifier circuit, is provided. The same advantages and modifications as previously described apply.

According to the present invention, a generator for the voltage supply of a motor vehicle is furthermore provided, the generator including at least one previously described rectifier circuit and/or a previously described electronic component. The same advantages and modifications as previously described apply.

The method according to the present invention for operating a rectifier circuit which contains a cathode terminal, an anode terminal and, between the cathode terminal and the anode terminal, at least one MOSFET transistor having an integrated inverse diode, includes, generally, the following steps:

selecting the drain-source breakdown voltage of the MOSFET transistor in accordance with the clamping voltage between the cathode terminal and the anode terminal; and operating the MOSFET transistor in the avalanche mode.

The same advantages and modifications as previously described apply.

Advantageous refinements of the present invention are described described in further detail below.

BRIEF DESCRIPTION OF THE DRAWINGS

Exemplary embodiments of the present invention are described in greater detail with reference to the figures and the description below.

DETAILED DESCRIPTION OF EXAMPLE EMBODIMENTS

Figure 2:
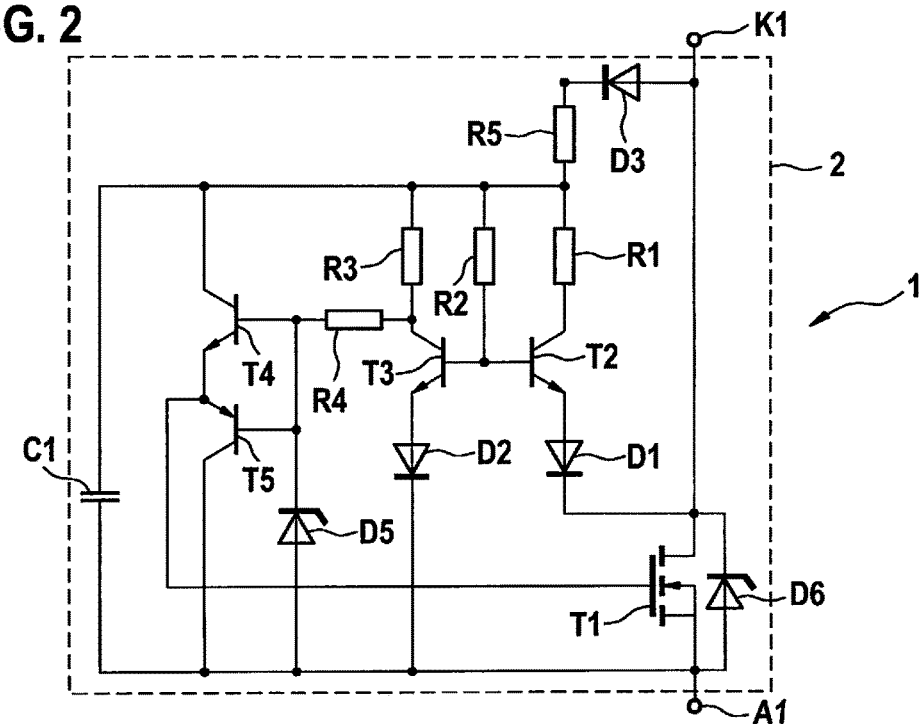
FIG. 2 shows a rectifier circuit according to the present invention.

A rectifier circuit 1 including an electronic circuit 2, which is situated between a cathode terminal K1 and an anode terminal A1, is represented in FIG. 2. In rectifier circuit 1, a power transistor composed of T1 and D6 is operated in avalanche breakdown. Power transistor T1/D6 has a drain-source breakdown voltage which corresponds to the desired clamping voltage. In applications in motor vehicles, for example, clamping voltages are in the range from 20 to 30 or 40 volts.

Figure 1:
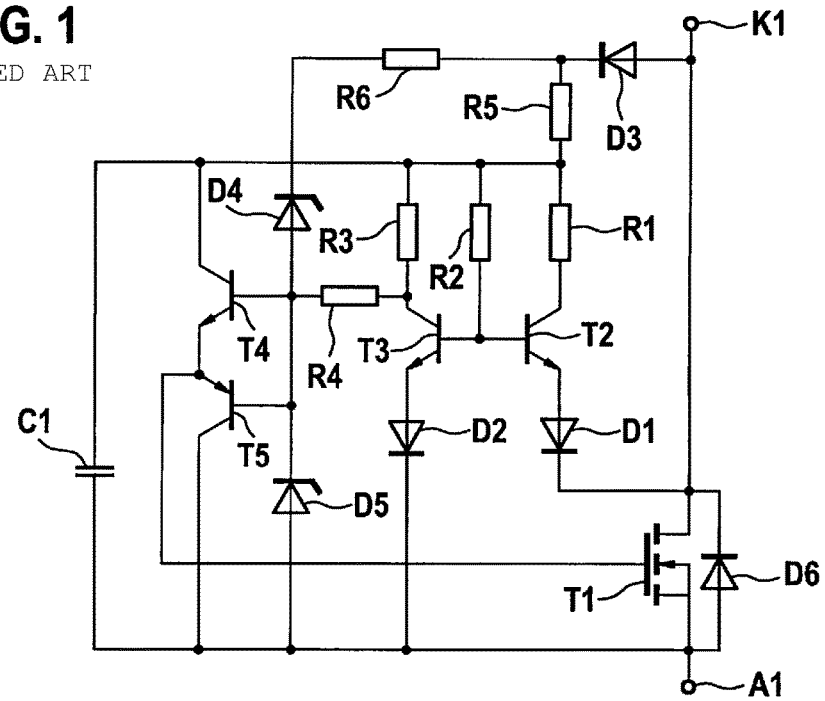
FIG. 1 shows a rectifier circuit from the related art.

As compared to FIG. 1, Zener diode D4 and resistor R6 are therefore omitted. For the sake of clarity, repetitions are dispensed with here and only the differences from FIG. 1 are explained.

In FIG. 1, the breakdown voltage of the transistor, at approximately 40 V, is high as compared to voltages of the utilization or application, and so an active activation of the transistor is required for the clamping. According to FIG. 2, however, the breakdown voltage, at approximately 20 V, is so low as compared to the voltages of the application that transistor T1 or diode D6 automatically clamps the voltage peaks. Diode D6 is represented here as a Zener diode in order to show that diode D6 functions as a Zener diode due to the avalanche mode.

The clamping takes place generally in two states: in one state, during short transient processes of the kind caused, for example, by the inductive connection of a generator to a vehicle electrical system of a motor vehicle; in the other state, during long transient processes of the kind which occur, for example, during a load dump.

In order to implement the circuit, the technology and transistor T1 are selected or dimensioned in such a way that the clamping voltage may be set by transistor T1. This means that the drain-source breakdown voltage of transistor T1 corresponds to the desired clamping voltage.

For power transistor T1/D6, a MOSFET in planar, vertical DMOS technology (double-diffused metal-oxide semiconductor), for example, may be utilized.

The on-resistance Ron of MOSFETs depends on its electric strength or on its breakdown voltage BVdss. The on-resistance Ron increases overproportionally with the blocking voltage. For vertical DMOS transistors, Ron increases proportionally with $BVdss^{2,5}$. As a result, due to the measure according to the present invention, the on-resistance of a synchronous rectifier according to FIG. 2 is advantageously reduced as compared to the original arrangement according to FIG. 1.

The operation in the avalanche mode also allows for the use of modern, avalanche-resistant MOSFET transistors having a small cell size. For example, transistors in trench MOSFET technology may now also be utilized. Trench MOS transistors are not particularly well suited for operation in the linear mode, due to their small structural size and high slope. The use of modern transistors in a circuit according to FIG. 1 is therefore extremely limited. If the avalanche mode is utilized instead of the linear mode, transistors having a small cell geometry such as, for example, trench transistors, may also be utilized.

What is claimed is:

1. A rectifier circuit, comprising:
    a cathode terminal;
    an anode terminal;
    an electronic circuit between the cathode terminal and the anode terminal, the electronic circuit including at least one MOSFET transistor having an integrated inverse diode, the electronic circuit being configured to operate the MOSFET transistor in an avalanche mode of the MOSFET transistor, the electronic circuit configured to rectify an alternating voltage applied between the cathode terminal and the anode terminal;
    wherein a drain-source breakdown voltage of the MOSFET transistor operated in the avalanche mode corresponds to a clamping voltage between the cathode terminal and the anode terminal of the rectifier circuit, wherein the MOSFET transistor clamps voltages of the applied alternating voltage at the drain-source breakdown voltage of the MOSFET.

2. The rectifier circuit as recited in claim 1, wherein the MOSFET transistor is a planar, vertical DMOSFET transistor.

3. The rectifier circuit as recited in claim 1, wherein the MOSFET transistor is a trench MOS transistor.

4. The rectifier circuit as recited in claim 1, wherein the MOSFET transistor is designed in such a way that a power loss incurred in the avalanche breakdown is distributed at least approximately uniformly over the active chip area.

5. The rectifier circuit as recited in claim 1, wherein the MOSFET transistor is designed in such a way that an injection of charge carriers into a gate oxide of the MOSFET transistor is avoided.

6. An electronic component for rectification of AC voltages, the electronic component including at least one rectifier circuit comprising:
a cathode terminal;
an anode terminal;
an electronic circuit between the cathode terminal and the anode terminal, the electronic circuit including at least one MOSFET transistor having an integrated inverse diode, the electronic circuit being configured to operate the MOSFET transistor in avalanche mode of the MOSFET transistor, the electronic circuit configured to rectify an alternating voltage applied between the cathode terminal and the anode terminal;
wherein a drain-source breakdown voltage of the MOSFET transistor operated in the avalanche mode corresponds to a clamping voltage between the cathode terminal and the anode terminal of the rectifier circuit, wherein the MOSFET transistor clamps voltages of the applied alternating voltage at the drain-source breakdown voltage of the MOSFET.

7. A generator for the voltage supply of a motor vehicle, which includes at least one rectifier circuit comprising:
a cathode terminal;
an anode terminal;
an electronic circuit between the cathode terminal and the anode terminal, the electronic circuit including at least one MOSFET transistor having an integrated inverse diode, the electronic circuit being configured to operate the MOSFET transistor in an avalanche mode of the MOSFET transistor, the electronic circuit configured to rectify an alternating voltage applied between the cathode terminal and the anode terminal;
wherein a drain-source breakdown voltage of the MOSFET transistor operated in the avalanche mode corresponds to a clamping voltage between the cathode terminal and the anode terminal of the rectifier circuit, wherein the MOSFET transistor clamps voltages of the applied alternating voltage at the drain-source breakdown voltage of the MOSFET.

* * * * *